United States Patent [19]

Kamijo

[11] Patent Number: 5,500,742

[45] Date of Patent: Mar. 19, 1996

[54] CONTROL UNIT OF FLASH MEMORY AND FACSIMILE MACHINE USING SUCH CONTROL UNIT

[75] Inventor: Eiji Kamijo, Isehara, Japan

[73] Assignee: Ricoh Company, Ltd., Tokyo, Japan

[21] Appl. No.: 74,536

[22] Filed: Jun. 11, 1993

[30] Foreign Application Priority Data

Jun. 12, 1992 [JP] Japan .................................... 4-179196
Mar. 2, 1993 [JP] Japan .................................... 5-066049

[51] Int. Cl.⁶ ..................................................... H04N 1/40
[52] U.S. Cl. ......................... 358/448; 358/444; 395/427; 365/230.03
[58] Field of Search ............................ 358/448, 261.4, 358/433, 404, 444, 443; 365/230.03, 230.09, 185; 395/425, 400, 250

[56] References Cited

U.S. PATENT DOCUMENTS

| | | | |
|---|---|---|---|
| 3,938,097 | 2/1976 | Niguette, III | 340/172.5 |
| 4,533,995 | 8/1985 | Christian et al. | 364/200 |
| 4,718,038 | 1/1988 | Yoshida | 364/900 |
| 4,757,468 | 7/1988 | Domenik et al. | 364/900 |
| 4,873,671 | 10/1989 | Kowshik et al. | 365/189.12 |
| 4,932,053 | 6/1990 | Fruhauf et al. | 380/4 |
| 4,974,193 | 11/1990 | Beutelspacher | 364/900 |
| 5,195,130 | 3/1993 | Weiss et al. | 379/98 |
| 5,210,716 | 5/1993 | Takada | 365/200 |
| 5,245,570 | 9/1993 | Fazio et al. | 365/185 |
| 5,245,572 | 9/1993 | Kosonocky et al. | 365/189.02 |
| 5,297,103 | 3/1994 | Higuchi | 365/230.03 |

FOREIGN PATENT DOCUMENTS

| | | |
|---|---|---|
| 58-36964 | 9/1984 | Japan . |
| 62-283497 | 12/1987 | Japan . |
| 62-283496 | 12/1987 | Japan . |
| 63-183700 | 7/1988 | Japan . |
| 3-179972 | 8/1991 | Japan . |
| 3-177158 | 8/1991 | Japan . |

OTHER PUBLICATIONS

Computer Organization—V. Carl Hamacher et al.—1990 pp. 325-333—McGraw-Hill Publishing Company.

Primary Examiner—Sr.; Edward L. Coles
Assistant Examiner—Madeleine Anti-Vinh Nguyen
Attorney, Agent, or Firm—Oblon, Spivak, McClelland, Maier & Neustadt

[57] ABSTRACT

A control unit controls the use of a flash memory in which a recording area is divided into a plurality of blocks. The control unit includes a SRAM for storing management information regarding history that blocks have been used for recording information, the management information being updated every time each block has been used, and a selecting controller for selecting, with reference to the management information stored in the SRAM, a block in which information is to be written from among the plurality of blocks in the recording area of the flash memory so that all the blocks of the flash memory are uniformly used, wherein the information is recorded in the block selected by the selecting means in the flash memory. A facsimile machine has the flash memory for temporally recording image data to be transmitted and/or received, and the above control unit for controlling the flash memory so that the image data is recorded in a block of the flash memory.

10 Claims, 7 Drawing Sheets

CONTROL UNIT OF FLASH MEMORY AND FACSIMILE MACHINE USING SUCH CONTROL UNIT

BACKGROUND OF THE INVENTION (1) Field of the Invention

The present invention relates to a control unit of a flash memory and a facsimile machine, such as a portable facsimile machine, having a flash memory for storing image data and the control unit of the flash memory.

(2) Description of the Related Art

A picture processor has been proposed in Japanese Laid Open Patent Application No. 3-179972 (a first reference). In this picture processor, when there is no idle area to record picture data in a memory, a recording operation is interrupted and the processor waits for protection of the recording operation to be canceled. When the protection is canceled, the recording operation automatically restarts. As a result, picture data is recorded in the idle area of the memory so that continuity of storage of picture data is maintained.

A facsimile machine has been also proposed in Japanese Laid Open Patent Application No. 3-177158 (a second reference). This facsimile machine is provided with a memory circuit for storing image data.

A flash memory, which is one type of rewritable non-volatile memory, is expected to be used as a large-capacity memory. A flash memory can be used, for example, as a memory for storing image data in a facsimile machine as disclosed in the second reference. In this case, the writing control of the flash memory can be performed in a manner, for example, as disclosed in the first reference.

However, if the writing control of the flash memory is performed so that image data is unmethodically stored in the idle area of the flash memory as disclosed in the first reference, the following disadvantages occur.

The number of rewrites (the rewritable number) of the flash memory generally is limited in a range between 10 thousands and 100 thousands. Thus, in a case where the flash memory is used as an image memory of the facsimile machine, the above limitation of the rewritable number of the flash memory must be considered. If the increase of the rewritable number is concentrated on only a part of the recording area in the flash memory, the part of the recording area becomes unusable sooner than other parts thereof. That is, the flash memory cannot be used for a long time under the maximum memory size. In this case, the flash memory in which the image data is to be stored overflows more quickly.

SUMMARY OF THE INVENTION

Accordingly, a general object of the present invention is to provide a novel and useful control unit of a flash memory and a facsimile machine using such in which the disadvantages of the aforementioned prior art are eliminated.

A more specific object of the present invention is to provide a control unit capable of rewriting information in a flash memory under a condition in which a recording area of the flash memory is usually uniformly used.

The above objects of the present invention are achieved by a control unit for controlling a flash memory in which a recording area is divided into a plurality of blocks, the control unit comprising: storage means for storing management information regarding history that blocks have been used for recording information, the management information being updated every time each block has been used; and selecting means for selecting, with reference to the management information stored in the storage means, a block in which information is to be written from among the plurality of blocks in the recording area of the flash memory so that all the blocks of the flash memory are uniformly used, wherein the information is recorded in the block selected by the selecting means in the flash memory.

Another object of the present invention is to provide a facsimile machine using the above control unit of the flash memory.

The above objects of the present invention are achieved by a facsimile machine comprising: a flash memory for temporally recording image data to be transmitted and/or received, the flash memory having a recording area divided into a plurality of blocks; and a control unit for controlling the flash memory so that the image data is recorded in a block of the flash memory, the control unit comprising: storage means for storing management information regarding history that blocks have been used for recording image data, the management information being updated every time each block has been used; and selecting means for selecting, with reference to the management information stored in the storage means, a block in which image data is to be written from among the plurality of blocks in the recording area of the flash memory so that all the blocks of the flash memory are uniformly used, wherein the image data is recorded in the block selected by the selecting means in the flash memory.

According to the present invention, a block in which information is to be written is selected from among the plurality of blocks of the flash memory so that all the blocks are uniformly used. Thus, information can be recorded in a flash memory under a condition in which a recording area of the flash memory is usually uniformly used.

Additional objects, features and advantages of the present invention will become apparent from the following detailed description when read in conjunction with the accompanying drawings.

DESCRIPTION OF THE PREFERRED EMBODIMENTS

A description will now be given, with reference to FIGS. 1–4, of a first embodiment of the present invention.

Figure 1:
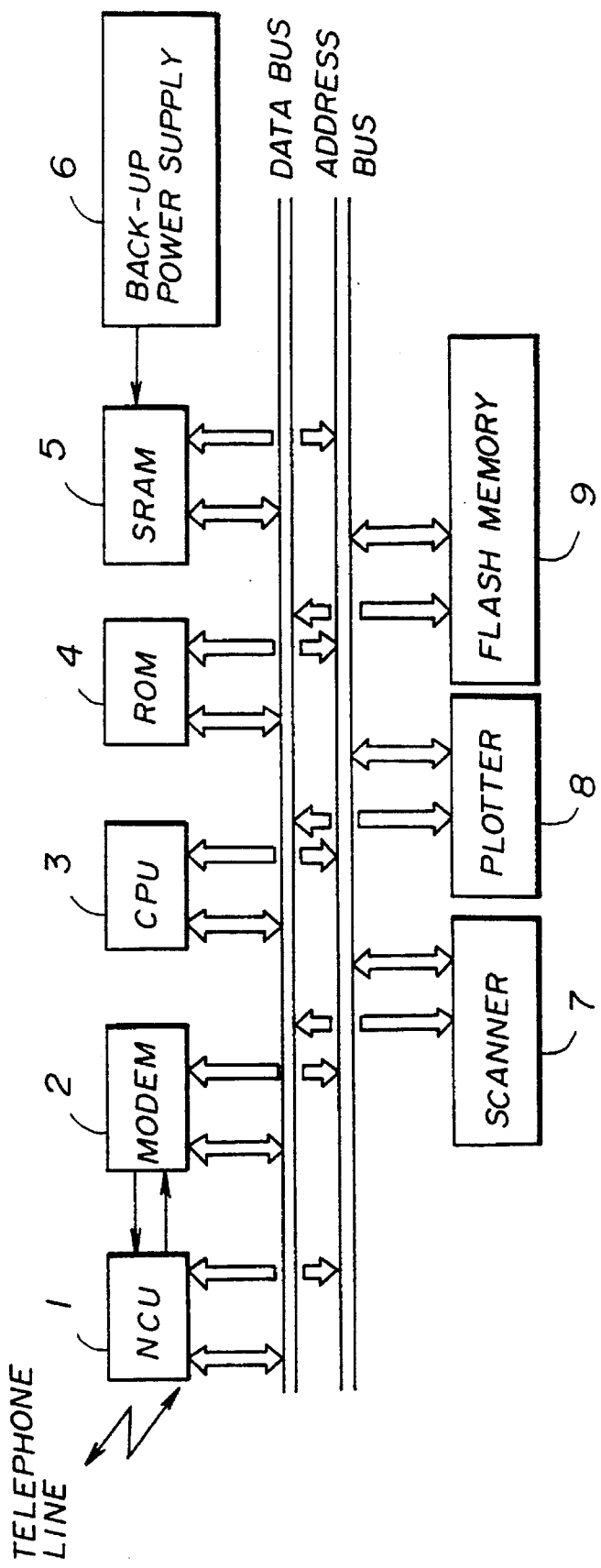
FIG. 1 is a block diagram illustrating a facsimile machine according to a first embodiment of the present invention.

A facsimile machine according to the first embodiment of the present invention is formed as shown in FIG. 1. Referring to FIG. 1, the facsimile machine has an NCU (Network Control Unit) 1, a modem (a modulator/demodulator) 2, a CPU (Central Processing Unit) 3, a ROM (Read Only Memory) 4, an SRAM (Static Random Access Memory) 5, a scanner 7, a plotter 8 and a flash memory 9 all of which are coupled to each other by a data bus and an address bus. A back-up power supply 6 (e.g. a lithium battery) is connected to the SRAM 5 so that the SRAM 5 is usually provided with electric power. Thus, even if a power supply of the facsimile machine is turned of, information is maintained in the SRAM 5.

The NCU 1 is coupled to a line and performs a calling operation, a detection of a ringing tone, a detection of a line current, a formation of a DC-loop between the facsimile and the line, and the like. The modem 2 modulates transmission data (TDX) to be supplied to the line and demodulates received data (RXD) from the line. The scanner 7 optically reads an original image on a document. The plotter 8 outputs an image corresponding to the received image data. The CPU 3 controls the NCU 1, the MODEM 2, the scanner 7, the plotter and the flash memory 9 in accordance with programs stored in the ROM 4. The transmission image data or the received image data is coded in accordance with an MH (Modified Huffman) coding method or an MR (Modified Read) coding method and is stored in the flash memory. The SRAM 5 has a managing area in which management information for the flash memory 9 is to be stored and a wording area of the CPU 3.

Communication management information regarding each facsimile communication between this facsimile machine and another facsimile machine (e.g. a destination) is recorded in the SRAM 5. The communication management information includes, for example, the following information;

1) a name of a destination, 2) a telephone number of the destination, 3) a total number of pages of documents having images to be transmitted, 4) a date, 5) a head address and an end address both of which identify an area in which image information is stored in the flash memory 9, 6) a file number for each facsimile communication, 7) error information, 8) information regarding the destination, 9) attribute data indicating transmission image data or received image data, and 10) attribute data indicating a coding method, a scanning density and the like.

The management of erasing numbers in the flash memory 9 is performed as follows. Each of the erasing number is a number at which information in a corresponding block in a recording area of the flash memory 9 has been erased (rewritten).

The recording area of the flash memory 9 is divided into a plurality of blocks each of which has a size falling in a range between 4k-bytes and 32k-bytes in general. If the flash memory has a recording area of 512k-bytes and each of the blocks has a size of 16k-bytes, the recording area of the flash memory is divided into 32 blocks.

Figure 2:
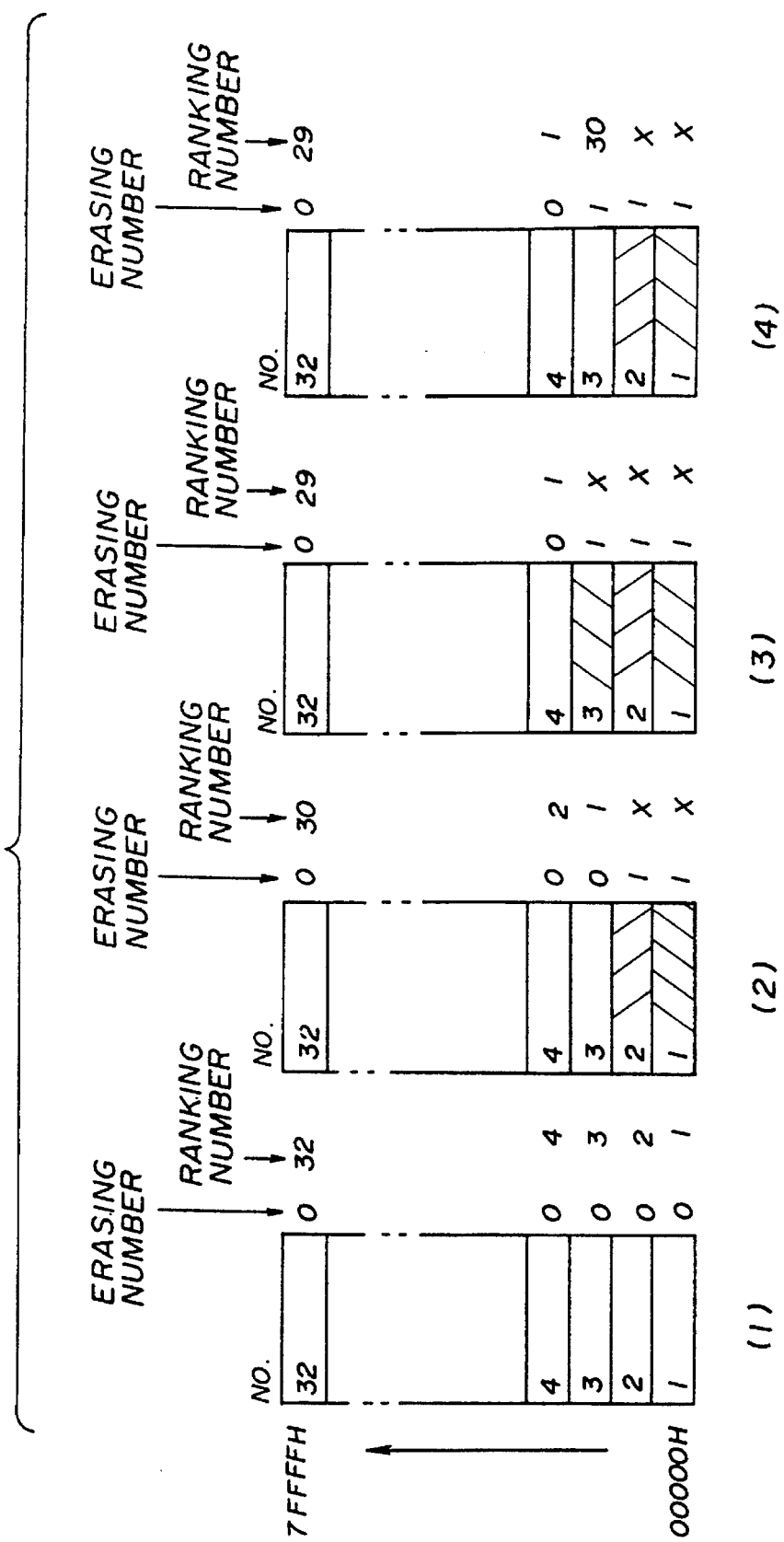
FIG. 2 is a diagram illustrating a recording area of a flash memory, shown in FIG. 1, in which a rewriting number of each block is controlled.

The erasing number of each of the 32 blocks in the recording area of the flash memory 9 is controlled by using the SRAM 5, as shown in FIG. 2. Referring to FIG. 2, the recording area, of the flash memory 9, having a size of 512k-bytes ($00000_H$ to $7FFFF_H$) is divided into 32 blocks each of which has a size of 16k-bytes. The SRAM 5 has a management table indicating the erasing number and a ranking number both of which corresponds to each of the blocks of the flash memory 9. The ranking number indicates priority of an order in which information in the respective blocks of the flash memory 9 is to be rewritten. The smaller the ranking number, the larger the priority of the order. Initially, the erasing number corresponding to each of the blocks of the flash memory 9 is set to "0" and the ranking number of the i-th block is set to "i" (i=1, 2, ... , and 32), as shown in FIG. 2 (1), in the management table formed in the SRAM 5.

Figure 3:
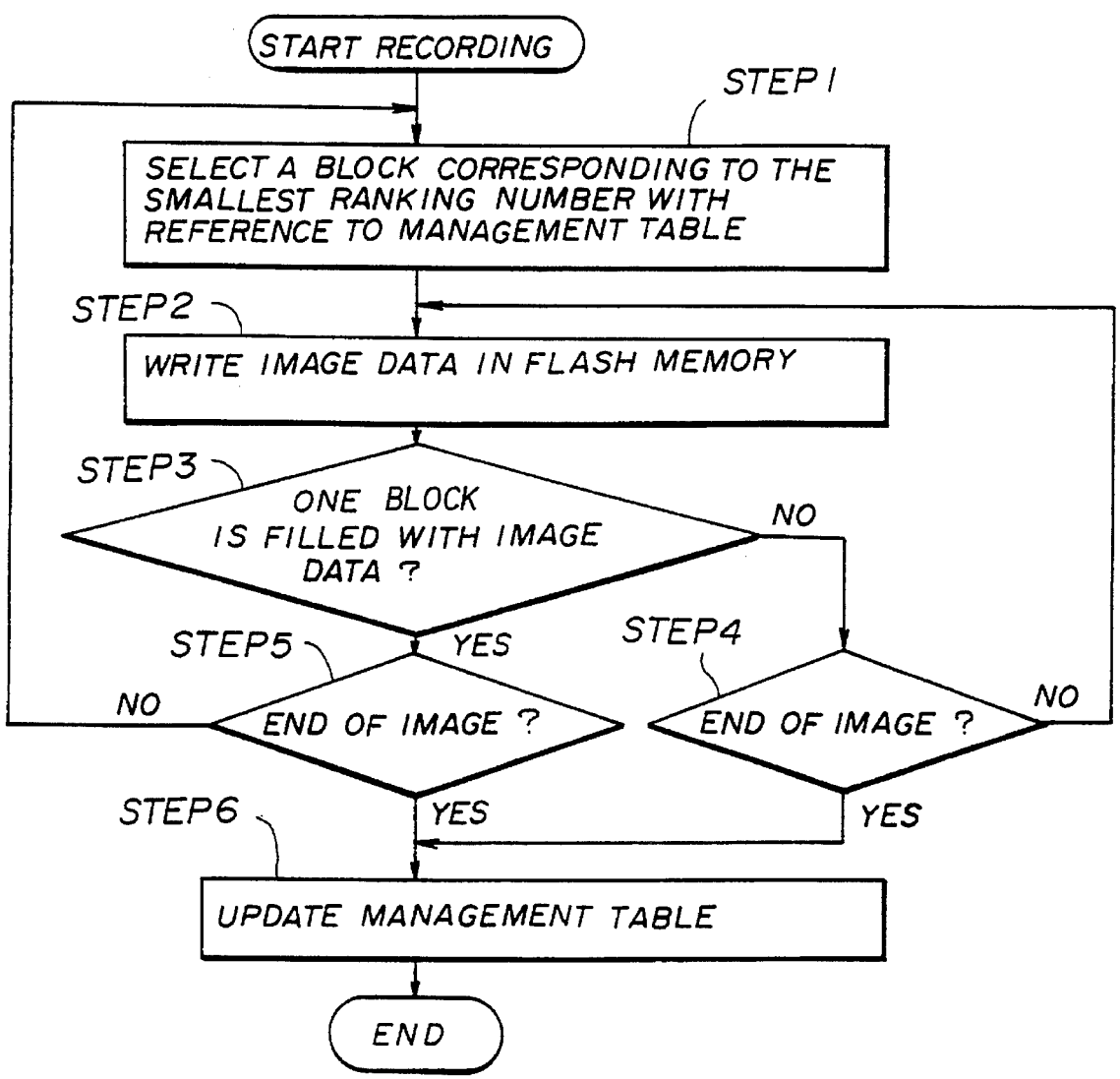
FIG. 3 is a flow chart illustrating a writing operation of the flash memory shown in FIG. 1.

In this state, to write image data (e.g. transmission image data) in the flash memory 9, the CPU 3 carries out a writing control of the flash memory 9 in accordance with a flow chart as shown in FIG. 3. Referring to FIG. 3, in step 1, the CPU 3 selects, with reference to the management table in the SRAM 5, a block having the smallest ranking number in the flash memory 9. In this case, the first block is selected. Image data is then written in the first block of the flash memory 9, in step 2. After this, it is determined, in step 3, whether or not the first block has been filled with the image data. If the first block has not been filled with the image data yet, it is determined, in step 4, whether or not all the image data has been written in the flash memory 9. If there is more image data to be written in the flash memory 9, steps 2, 3 and 4 are repeated and the image data is continuously written in the first block of the flash memory 9. On the other hand, when the first block of the flash memory has been filled with the image data, the CPU 3 determines, in step 5, whether or not all the image data has been written in the flash memory. If there is more image data to be written in the flash memory 9, the process returns to step 1. In step 1, the CPU 3 selects, with reference to the management table in the SRAM 5, a block having the smallest erasing number at this time in the flash memory 9. In this case, the second block is selected. The image data is written in the second block of the flash memory 9 in accordance with steps 2, 3, 4 and 5. If it is determined, in step 4 or 5, that there is no image data to be written in the flash memory 9, the writing operation is completed. After this, in step 6, the management table in the SRAM 5 is updated. That is, the erasing numbers of the first and second blocks are incremented to "1" as shown in FIG. 2 (2), and the ranking numbers of the respective blocks are changed so that ranking numbers "1" to "30" respectively correspond to the third block to the 32-th block. The ranking numbers of the first and second blocks in which the image data has not yet been stored are, as shown by marks (x) in FIG. 2 (2), in the management table in the SRAM 5. At this time, the third block of the largest priority at which the image data is to be rewritten.

Further, when there is a request for storing image data in the flash memory 9, the image data is written in the third block corresponding to the smallest ranking number indicating the largest priority, in accordance with the above process in steps 1, 2, 3, 4 and 5. After the image data is written in the third block of the flash memory 9, the erasing number of the third block is incremented to "1", the ranking numbers of respective blocks are changed so that the ranking numbers "1" to "29" respectively correspond to the fourth block to 32-th block, as shown in FIG. 2 (3). The ranking number of the third block in which the image data to be transmitted has been stored is blanked, as shown by the mark in FIG. 2 (3).

In the writing control described above, if, before a block is filled with image data, there becomes no image data to be written in the flash memory 9, the ranking number corresponding to the block is not blanked, Thus, in the next writing control, the above block is first selected to store image data based on the ranking number.

When this facsimile machine is connected to the destination via the line, the CPU 3 carries out a reading control for reading out the image data to be transmitted to the destination from the flash memory 9. The reading control is carried out in accordance with a flow chart as shown in FIG. 4.

Figure 4:
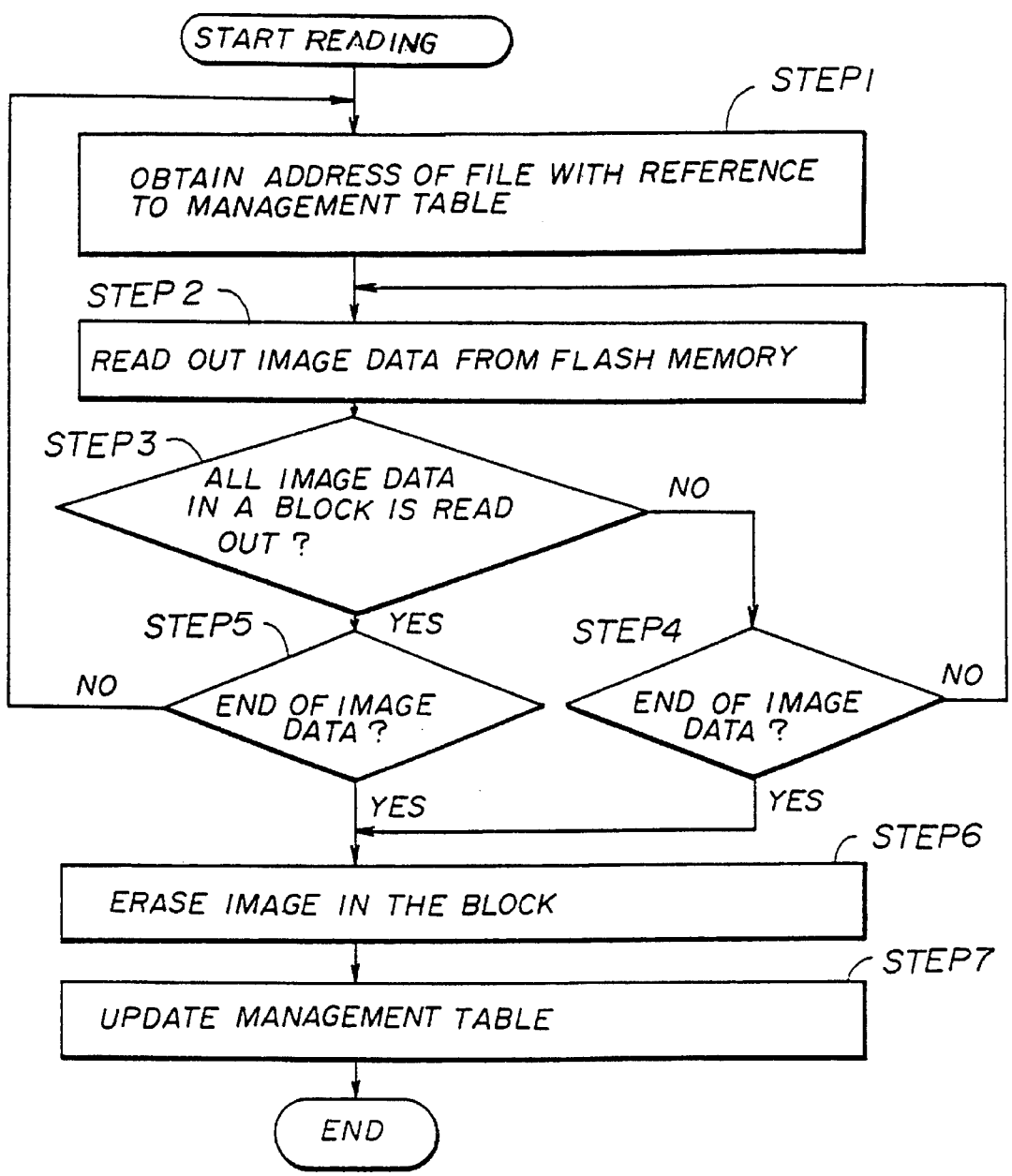
FIG. 4 is a flow chart illustrating a reading operation of the flash memory shown in FIG. 1.

Referring to FIG. 4, in step 1, addresses identifying an area, in which a file having the image data to be transmitted to the destination is stored, are obtained, with reference to the management information in the SRAM 5. The addresses are not always in sequence. Thus, information used for coupling discrete addresses is included in the management information. In step 2, the image data is read out from the area, in the flash memory 9, identified by an addresses obtained in step 1. Here, for example, assuming that the area identified by the address is the third block in the flash memory 9, in step 3, the CPU 3 determines whether or not all the image data has been read out from the third block. If all the image data has not been read out from the third block yet, it is determined, in step 4, whether or not the reading process for the file is completed. If the reading process for the file has not completed yet, steps 2, 3 and 4 are repeated and the image data is continuously read out from the area in the third block. When all the image data has been read out from the third block, it is determined, in step 5, whether or not all the image data to be transmitted to the destination has been read out from the flash memory 9. If all the image data has not been read out from the third block yet, steps 1, 2, 3, 4 and 5 are repeated.

On the other hand, when it is determined, in step 4 or 5, that all the image data has been read out from the flash memory 9, the image data in blocks (including the third block) from which all the image data has been read out is erased in step 6. After this, in step 7, the erasing result is written in the management table in the SRAM 5. For example, the ranking number of the third block is set to the largest number "30" corresponding to the smallest priority, as shown in FIG. 2 (4), in the management table in the SRAM 5. After the management table is updated, the reading control is completed.

According to the above reading control of the flash memory 9, the ranking number of a block from which image data has been erased last is set to the largest number so that the priority of the block is smallest among all the blocks in the flash memory 9. Thus, as a block in which the image data is to be written is selected in the increasing order of the ranking number from the smallest number, a block corresponding to the smallest erasing number is usually selected as a block in which image data is to be written. As a result, respective blocks in the flash memory 9 are uniformly used for recording image data.

A description will now be given, with reference to FIGS. 5 to 7, of a second embodiment of the present invention.

Figure 5:
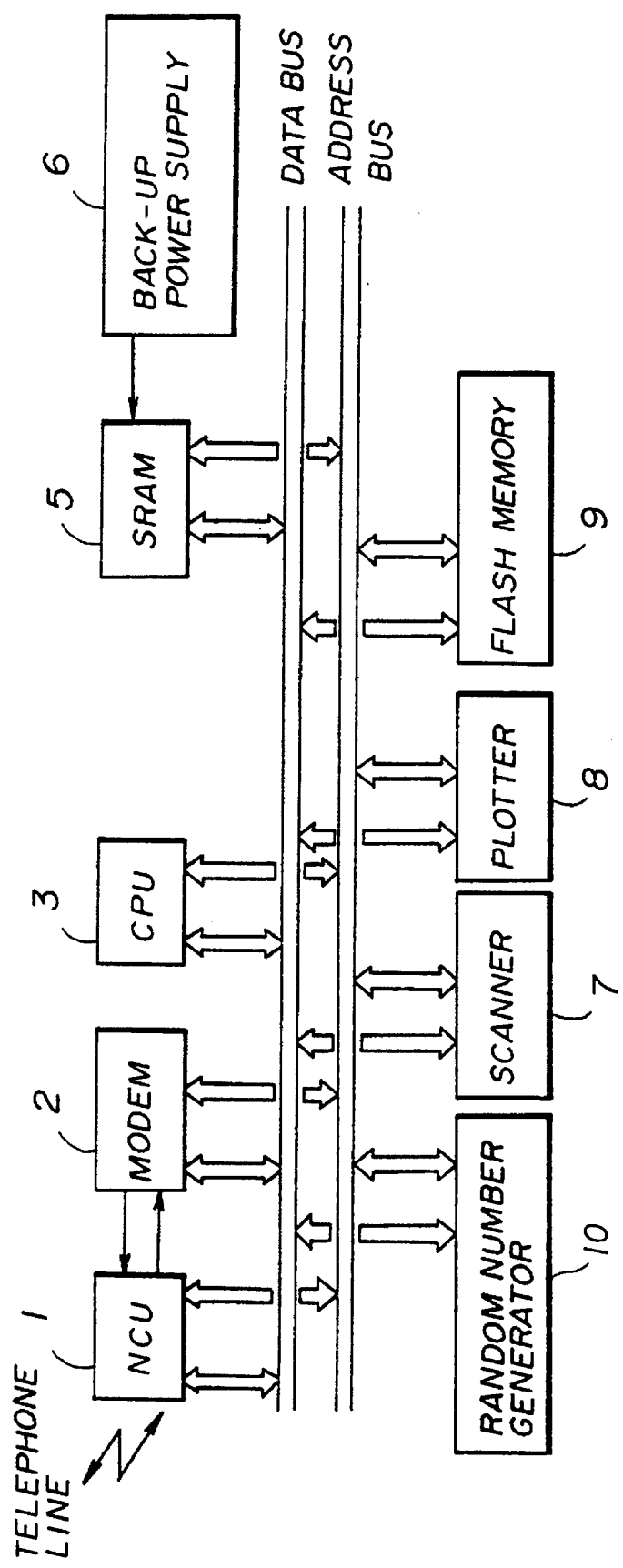
FIG. 5 is a block diagram illustrating a facsimile machine according to a second embodiment of the present invention.

A facsimile machine according to the second embodiment of the present invention is shown in FIG. 5. In FIG. 5, those parts which are the same as those shown in FIG. 1 are given the same reference numbers.

Referring to FIG. 5, the facsimile machine according the second embodiment is provided with the NCU 1, the MODEM 2, the CPU 3, the SRAM 5, the scatter 7, the plotter 8 and the flash memory 9 all of which are connected to each other by the data bus and the address bus, in the same manner as that shown in FIG. 1 (the first embodiment). In this facsimile machine, the ROM 4 shown in FIG. 1 is omitted and the programs for executing facsimile operations are stored in the flash memory 9. That is, a recording area of the flash memory 9 is divided into a first area in which the programs are to be stored and a second area in which image data is to be stored. The facsimile machine is provided with a random number generator 10 connected to the address bus and data bus. The random number generator 10 is activated by the CPU 3, so that numbers "1" to "32" are generated at random by the random number generator 10.

Figure 7:
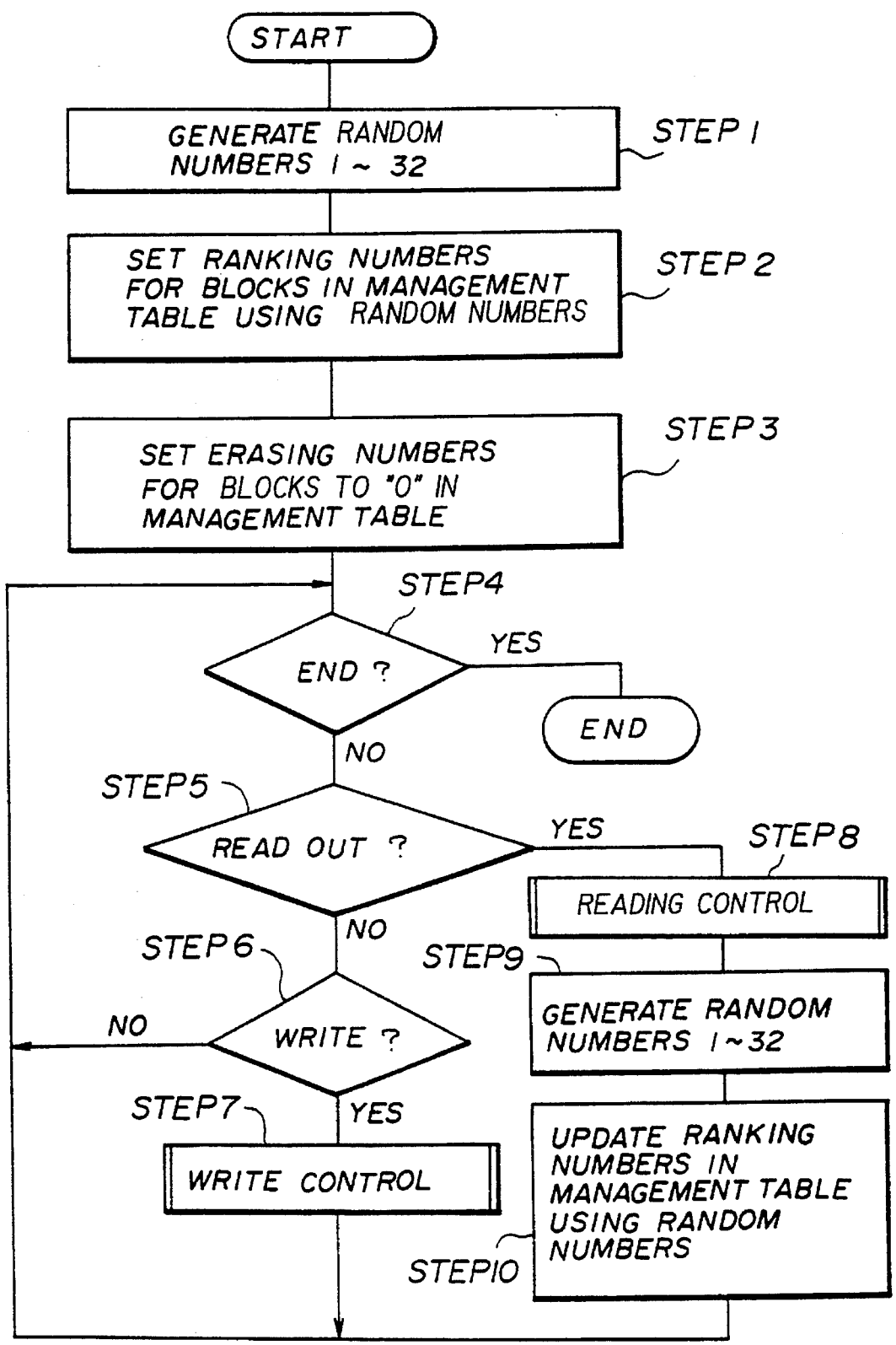
FIG. 7 is a flow chart illustrating an operation of the control unit shown in FIG. 5.

The CPU 3 performs the writing control for writing image data in the flash memory 9 and the reading control for reading out image data from the flash memory 9 in a flow chart as shown in FIG. 7.

Figure 6:
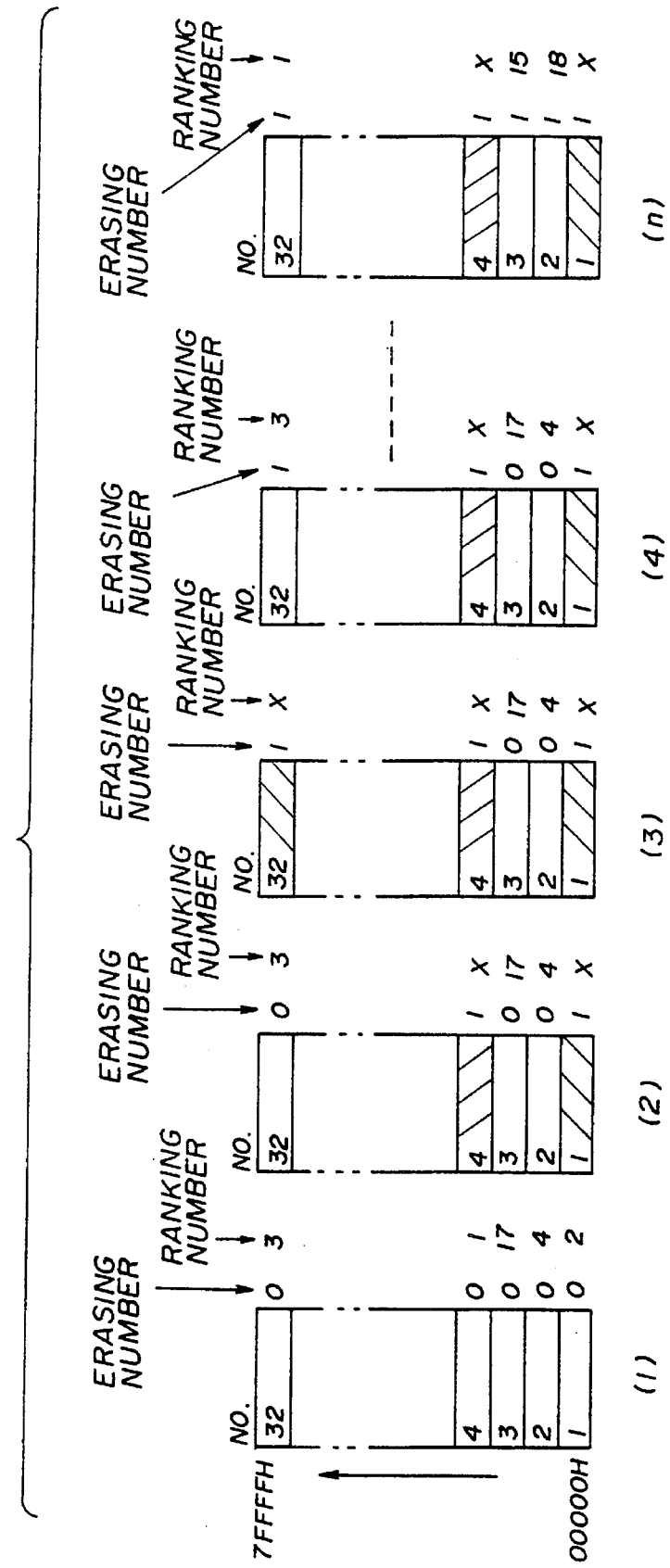
FIG. 6 is a flow chart illustrating a recording area of the flash memory, shown in FIG. 5, in which a rewriting number of each block is controlled.

Referring to FIG. 7, in step 1, the CPU 3 activates the random number generator 10, so that numbers "1" to "32" are output at random from the random number generator 10. The numbers output from the random number generator 10 are successively supplied to the CPU 3 via the data bus. In step 2, the ranking numbers for the respective blocks in the management table are set to the numbers supplied from the random number generator 10. Assuming numbers are supplied from the random number generator 10 as follows;

2, 4, 17, 1, . . . , and 3, the ranking numbers for the first, second, third, fourth, . . . , and 32-th blocks are respectively set to "2", "4", "17", "1", . . . , and "3", as shown in FIG. 6 (1), in the management table stored in the SRAM 5. After this, in step 3, the erasing number of each of the blocks is initially set to "0", as shown in FIG. 6 (1), in the management table. When the initial set of the ranking number and of the erasing number in the management table is completed, the CPU 3 determines, in step 4, whether or not an end instruction is received. If the CPU 3 receives the end instruction, the process is completed. On the other hand, when the end instruction has not been received yet, it is determined, in steps 5 and 6, whether or not the reading instruction and the writing instruction are received. If it is determined that the writing instruction is received, the CPU 3 performs the writing control in step 7. The writing control is performed in accordance with the flow chart shown in FIG. 3. That is, a block corresponding to the smallest ranking number is usually selected in the flash memory 9, and the image data is written in the selected block. In a case, the ranking numbers are arranged as shown in FIG. 6 (1), in the management table, first, the image data is written in the fourth block corresponding to the ranking number "1" and next image data is written in the first block corresponding to the ranking number "2", as shown in FIG. 6 (2). In the management table, the erasing numbers corresponding the first and fourth blocks are incremented to "1" and the ranking numbers corresponding to the first and fourth blocks are blanked, as shown in FIG. 6 (2). Further, when image data to be written is supplied, for example, from the scanner 7, the image data is written in the 32-th block corresponding to the ranking number "3" which is the smallest number at this time. In the management table, the erasing number corresponding to the 32-th block is incremented to "1" and the ranking number corresponding to the 32-th block is blanked, as shown in FIG. 6 (3). After the writing control is completed, the above steps 4, 5 and 6 are repeated.

When the CPU 3 receives the reading instruction, the reading control is performed in step 8. The reading control is performed in accordance with the flow chart shown in FIG. 4. That is, assuming image data of a file identified by the management information in the SRAM 5 is stored in the 32-th block of the flash memory 9, the image data is read out from the 32-th block of the flash memory 9, the ranking number corresponding to the 32-th block is reset to "3" as shown in FIG (4), in the management table. The image data is then erased from the 32-th block of the flash memory 9.

After the image data is erased from the 32-th block of the flash memory 9, in step 9, the CPU 3 activates the random number generator 10, so that numbers "1" to "32" are output at random from the random number generator 10 again. The numbers output from the random number generator 10 are successively supplied to the CPU 3 via the data bus. In step 10, the ranking numbers for the respective blocks in the management table are reset to the numbers supplied from the random number generator 10. Assuming numbers are supplied from the random number generator 10 as follows;

10, 18, 15, 8, . . . , and 1, the ranking numbers for the first, second, third, fourth, . . . , and 32-th blocks are respectively to be reset to "10", "18", "5", "8", . . . , and "1" in the management table stored in the SRAM 5. However, as the image data stored in the first and fourth blocks have not been read out yet, the ranking numbers corresponding to the first and fourth blocks are blanked. As a result, the ranking numbers of the second, third, . . . , and 32-th blocks are respectively reset to "18", "15", . . . , and "1", as shown in FIG. 6 (n), in the management table.

The above process in steps 1 through 10 are repeated until the end instruction is received by the CPU 3.

According to the second embodiment, as the respective blocks in the flash memory 9 are selected at random when image data is to be written in the flash memory 9, the respective blocks are uniformly used for recording image data.

The present invention is not limited to the aforementioned embodiments, and variations and modifications may be made without departing from the scope of the claimed invention.

What is claimed is:

1. A control unit for controlling a flash memory in which a recording area is divided into a plurality of blocks, said control unit comprising:

priority setting means for setting priority of each of the blocks, at random, in which information is to be written; and selecting means for selecting, in accordance with the priority set by said priority setting means, a block in which information is to be written from among said plurality of blocks in the recording area of said flash memory, wherein the information is recorded in the block selected by said selecting means in said flash memory.

2. The control unit as claimed in claim 1, wherein said priority setting means has a random number generator for generating numbers at random, each of the numbers indicating a degree of the priority, and a storage means for storing the numbers supplied from said random number generator under a condition in which each of the numbers corresponds to one of the plurality of blocks, and wherein said selecting means selects, with reference to the numbers in said storage means, a block corresponding to a number indicating the highest priority.

3. The control unit as claimed in claim 2, wherein said priority setting means further comprises updating means for updating the numbers stored in said storage means to new numbers generated by said random number generator every time information in a block of the flash memory is erased.

4. The control unit as claimed in claim 2, wherein said storage means has a non-volatile memory unit.

5. A facsimile machine comprising:

a flash memory for temporally recording image data to be transmitted and/or received, said flash memory having a recording area divided into a plurality of blocks; and a control unit for controlling said flash memory so that the image data is recorded in a block of said flash memory, said control unit comprising:

priority setting means for setting priority of each of the blocks, at random, in which image data is to be written; and selecting means for selecting, in accordance with the priority set by said priority setting means, a block in which image data is to be written from among said plurality of blocks in the recording area of said flash memory, wherein the image data is recorded in the block selected by said selecting means in said flash memory.

6. The facsimile machine as claimed in claim 5, wherein said priority setting means has a random number generator for generating numbers at random, each of the numbers indicating a degree of the priority, and a storage means for storing the numbers supplied from said random number generator under a condition in which each of the numbers corresponds to one of the plurality of blocks, and wherein said selecting means selects, with reference to the numbers in said storage means, a block corresponding to a number indicating the highest priority.

7. The facsimile machine as claimed in claim 6, wherein said priority setting means further comprises updating means for updating the numbers stored in said storage means to new numbers generated by said random number generator every time image data in a block of the flash memory is erased.

8. The facsimile machine as claimed in claim 6, wherein said storage means has a non-volatile memory unit.

9. A control unit for controlling a flash memory in which a recording area is divided into a plurality of blocks, said control unit comprising:

means for keeping track of a number of times information in each of said blocks has been erased;

priority setting means for setting priority of each of the blocks, at random, in which information is to be written; and selecting means for selecting, in accordance with the priority set by said priority setting means and in accordance with the number of times information in each of said blocks has been erased, a block in which information is to be written from among said plurality of blocks in the recording area of said memory, wherein the information is recorded in the block selected by said selecting means in said memory.

10. A system for controlling a flash memory in which a recording area is divided into a plurality of blocks, comprising:

priority setting means for setting priority of each of the blocks, at random, in which information is to be written; and selecting means for selecting, in accordance with the priority set by said priority setting means, a block in which information is to be written from among said plurality of blocks in the recording area of said memory, wherein the information is recorded in the block selected by said selecting means in said memory, and wherein information stored within said blocks is only stored in one memory location at a predetermined time.

* * * * *